United States Patent
Hasnain et al.

[11] Patent Number: 5,866,936
[45] Date of Patent: Feb. 2, 1999

[54] MESA-STRUCTURE AVALANCHE PHOTODIODE HAVING A BURIED EPITAXIAL JUNCTION

[75] Inventors: Ghulam Hasnain, Union City; James N. Hollenhorst, Saratoga; Chung-Yi Su, Milpitas, all of Calif.

[73] Assignee: Hewlett-Packard Company, Palo Alto, Calif.

[21] Appl. No.: 831,843

[22] Filed: Apr. 1, 1997

[51] Int. Cl.⁶ .......................... H01L 31/00; H01L 31/107; H01L 29/861
[52] U.S. Cl. .......................... 257/452; 257/186; 257/438; 257/466; 257/605; 438/39; 438/41
[58] Field of Search .................. 257/186, 438, 257/452, 466, 605; 438/39, 41

[56] References Cited

U.S. PATENT DOCUMENTS

| | | | |
|---|---|---|---|
| 3,886,579 | 5/1975 | Ohuchi et al. | 357/13 |
| 4,326,211 | 4/1982 | Smeets | 357/30 |
| 4,684,969 | 8/1987 | Taguchi | 357/30 |
| 4,719,498 | 1/1988 | Wada et al. | 257/466 |
| 4,840,916 | 6/1989 | Yasuda et al. | 437/3 |
| 4,885,622 | 12/1989 | Uchiyama et al. | 257/466 |
| 5,045,908 | 9/1991 | Lebby | 257/466 |
| 5,057,891 | 10/1991 | Torikai | |
| 5,075,750 | 12/1991 | Tagawa | 257/30 |
| 5,132,747 | 7/1992 | Matsushima et al. | 437/3 |
| 5,144,381 | 9/1992 | Furuyama et al. | 357/30 |
| 5,157,473 | 10/1992 | Okazaki | 357/30 |
| 5,179,430 | 1/1993 | Toriakai | 257/186 |
| 5,204,539 | 4/1993 | Tsuji et al. | 257/21 |
| 5,233,209 | 8/1993 | Radgers et al. | 257/171 |
| 5,308,995 | 5/1994 | Tsuji et al. | 257/17 |
| 5,343,055 | 8/1994 | Davis et al. | 257/186 |
| 5,569,942 | 10/1996 | Kusakabe | 257/186 |
| 5,610,416 | 3/1997 | Su et al. | 257/186 |
| 5,654,578 | 8/1997 | Watanabe | 257/438 |

FOREIGN PATENT DOCUMENTS

| | | | |
|---|---|---|---|
| 1298640 | 4/1992 | Canada | 345/24 |
| 61-80875 | 4/1986 | Japan | 257/438 |
| 61-144076 | 7/1986 | Japan | 257/438 |
| 1-28970 | 1/1989 | Japan | 257/438 |
| 2-248081 | 10/1990 | Japan | 257/438 |
| 2-296379 | 12/1990 | Japan | 257/438 |
| 6-61521 | 3/1994 | Japan | 257/438 |

Primary Examiner—Carl W. Whitehead
Assistant Examiner—Allan R. Wilson
Attorney, Agent, or Firm—Ian Hardcastle

[57] ABSTRACT

A mesa-structure avalanche photodiode in which a buffer region in the surface of the mesa structure effectively eliminates the sharply-angled, heavily doped part of the cap layer that existed adjacent the lightly-doped n-type multiplication layer and p-type guard ring before the buffer region was formed. This reduces electric field strength at the ends of the planar epitaxial P-N junction and prevents edge breakdown in this junction. The lateral extent of the guard ring is defined by a window formed in a masking layer prior to regrowth of the guard ring. This guard ring structure eliminates the need to perform additional processing steps to define the lateral extent of the guard ring and passivate the periphery of the guard ring.

12 Claims, 5 Drawing Sheets

MESA-STRUCTURE AVALANCHE PHOTODIODE HAVING A BURIED EPITAXIAL JUNCTION

FIELD OF THE INVENTION

The present invention pertains to the field of avalanche photodiodes. Specifically, the invention pertains to a high-gain semiconductor avalanche photodiode.

BACKGROUND OF THE INVENTION

An avalanche photodiode (APD) is a semiconductor device in which charge carriers are generated and multiplied when exposed to light. They are widely used in high speed communication. APDs operate under reverse bias with a high peak electric field close to breakdown. Incident photons in the appropriate wavelength range, i.e., 300–1600 nm, create charge carriers (electrons and/or holes) in the semiconductor material. Charge carriers are accelerated toward opposite electrodes by the large reverse bias. The accelerated carriers then produce secondary carriers by impact ionization within the semiconductor material. The resultant avalanche can produce gains in excess of $10^3$. APDs can improve the sensitivity of optical receivers by more than 10 dB.

For long wavelength applications, e.g., wavelengths in the range 1000–1600 nm, the light absorption layer of the APD must be formed from a narrow band-gap semiconductor material. However, the large reverse bias typically creates excessive noise due to a large dark current flowing through the narrow band-gap material. To suppress this excessive noise, a separate layer of a material having a wider band-gap is provided, allowing avalanche multiplication to take place. An APD constructed in this manner is commonly known as a separate absorption and multiplication (SAM) APD.

Generally, there are two types of SAM-APD structure: planar structure or mesa structure. In mesa structure SAM-APDs, the multiplication layer is grown epitaxially. This provides precise control over the layer's thickness and impurity dopant concentration. Mesa structures, however, expose a high electric field region at the mesa surface. Until recently, passivation of this surface has not been adequately demonstrated, and mesa structure APDs have not been favored.

Properly-designed planar structure APDs have a lower electric field strength at the surface of the structure than mesa structure APDs. In planar structure APDs, the P-N junction is commonly formed by diffusing p-type dopants into epitaxially-grown n-type layers. The thickness of the multiplication layer is defined by the position of the P-N junction. FIG. 1 shows a conventional planar SAM-APD in which the n-type InP buffer layer 10, the n⁻ InGaAs light absorption layer 11, the n InGaAsP intermediate layer 12, the n InP avalanche multiplication layer 13, and the n⁻ InP window layer 14 are epitaxially grown in sequence on the n⁺ InP substrate 15. The p⁺ InP diffusion layer 16 and the p-type guard ring 17 are formed in the window layer 14 by selective diffusion or ion implantation techniques. The P-side electrode 18 is provided on the upper surface of the device, and the N-side electrode 19 is formed on the lower surface of the substrate 15.

In the SAM-APD just described, holes generated by light absorption in the n⁻ InGaAs light absorption layer 11 drift into the n InP multiplication layer 13 where they initiate avalanche multiplication. Ideally, the APD is designed so that the field in the light absorption layer 11 is kept low enough to suppress the dark current. Holes generated in the n⁻ InGaAs light absorption layer 11 are accumulated in the valence band of the heterojunction formed between the light absorption layer 11 and the n-type InP multiplication layer 13. This increases the response time of the APD. To overcome this disadvantage, the n⁻ InGaAsP intermediate layer 12 is disposed between the n⁻ InGaAs light absorption layer 11 and the n-type InP multiplication layer 13.

To obtain high sensitivity, it is necessary to obtain uniform avalanche multiplication along the P-N junction 21 between the n⁻ InP window layer 14 and the p⁺ InP layer 16. To that end, it is necessary to restrict the region of breakdown to the central portion of the APD, coextensive to a planar portion of the P-N junction 21. It has long been recognized that curvature increases the electric field strength. Therefore, for a given potential difference across the P-N junction 21, the electric field strength is greater in the curved portion 20 of the P-N junction than in the planar portion. This increased field strength can lead to premature breakdown at the curved portion 20. This breakdown is commonly known as edge breakdown.

To avoid edge breakdown, the guard ring 17 is provided to surround the p⁺ InP layer 16. The guard ring 17 is formed so that it creates a second P-N junction 22 between both the window layer 14 and the multiplication layer 13. The second P-N junction is generally deeper than the P-N junction 21. The guard ring effectively eliminates the curved portion 20 of the P-N junction 21.

In the conventional planar APD, described above, the n⁻ InP window layer 14 is often given a low carrier concentration and is epitaxially grown on the n-type InP avalanche multiplication layer 13, which has a higher carrier concentration. P-N junction 22 is formed by selective diffusion, or implantation and annealing, at high temperatures of Be ions or the like into the window layer 14. P-N junction 21 is typically formed by selective diffusion of the p-type dopants forming the layer 16 into the layer 14 using Cd or Zn as a diffusion source.

To achieve an APD with high gain-bandwidth product, the P-N junction 21 is positioned as deep as possible so that it is located near or within the avalanche multiplication layer 13. Further, to obtain a short response time, the multiplication layer must have a high concentration of dopants. This requires a high degree of control of both the doping and thickness of the multiplication layer 13 and the guard ring 17 so that a sufficient quantity of photo-generated carriers are extracted to achieve the desired gain. Also, the electric field in the absorption layer 11 must be kept low to avoid excessive dark current.

The limitations of diffusion techniques for manufacturing APDs are manifest. The precision of the structures that can be made using diffusion is limited. For example, to achieve a gain-bandwidth product of 100 GHz, a uniformly-doped multiplication layer must have a thickness of about 0.7 $\mu$m with a required precision of ±0.04 $\mu$m. It is very difficult to achieve this degree of precision with diffusion technology. For similar reasons, it is difficult to control the doping and position of the guard ring accurately. This often leads to low fabrication yields and increased costs in the production of APDs. Low fabrication yield is a significant drawback in manufacturing an APD with high gain-bandwidth product.

In U.S. patent application Ser. No. 08/389,375, the inventors of the present invention disclosed a mesa-structure SAM-APD in which the problem of passivating the planar P-N junction at the mesa surface was solved by epitaxially regrowing a guard ring around the mesa. A cross-sectional view of the device is shown in FIG. 2. The n⁻ InGaAs light absorption layer 23, the n⁻ InGaAsP intermediate layer 24, the n InP avalanche multiplication layer 25 and the homogeneous p⁺ InP cap layer 27 are epitaxially grown in sequence on the n⁺ InP substrate 26. The multiplication layer and the cap layer form the planar P-N junction 28. A portion extending completely through the thickness of the cap layer 28, and a portion extending part-way through the thickness of the multiplication layer 25 are removed to form a mesa structure.

The guard ring 29 is epitaxially regrown on the multiplication layer, surrounding the mesa, and forms the second P-N junction 34 at the interface between the guard ring and the multiplication layer 25. The guard ring protects the planar P-N junction 28 which, prior to the guard ring being regrown, is exposed at the surface of the mesa structure. The guard ring 29 is preferably formed from the same semiconductor material as the p⁺ cap layer 27, but has a lower concentration of impurities to reduce the electric field in the guard ring.

The second P-N junction 34 includes the planar portion 36 and the curved portion 37. The planar portion 36 is located adjacent and parallel to the multiplication layer 25. The curved portion 37 is positioned closer to the light absorption layer 23 than the first P-N junction 28. In addition, the guard ring 29 preferably has a lower impurity concentration than the multiplication layer 25. This structure substantially reduces the electric field proximate to the first P-N junction, reducing the likelihood of edge breakdown.

The mesa-structure APD shown in FIG. 2 lacks a window layer corresponding to the window layer 14 of the conventional planar-structure APD shown in FIG. 1. Omitting the window layer greatly reduces avalanche build-up time, which decreases the response time of the mesa-structure APD compared to the conventional planar-structure APD.

The P-side electrode 30 is placed in contact with the cap layer 27. The N-side electrode 31 is formed on the lower surface of the semiconductor substrate 26.

Test results on the above-described mesa-structure SAM-APDs indicate that some residual edge breakdown occurs. The inventors' analysis of the cause of such residual edge breakdown indicates that the gain of the APD is not uniform across the first P-N junction, but has peaks where this junction intersects the side of the mesa structure. The inventors' analysis indicates that the cause of the gain peaks is the acute-angled corner 32 that remains at the interface between the mesa structure and the epitaxially regrown guard ring. The sharply-angled portion of highly-doped p-type material located adjacent the lightly doped multiplication layer and guard ring causes a sharp increase in the electric field strength at the ends of the first P-N junction.

Additionally, production yields of the above-described mesa-structure SAM-APDs were less than expected. When multiple APDs were made on a common substrate and a single guard ring layer is epitaxially regrown over the entire surface of the wafer, a subsequent additional mesa etch is required to isolate the guard rings of the devices from one another. When the guard rings are defined by etching, the peripheries of the guard rings need to be passivated by a second regrowth or by a film of a suitable dielectric, such as silicon nitride, to prevent excessive surface leakage current. The additional processing reduces the yield of good APDs.

What is needed is a SAM-APD that does not suffer from edge breakdown at the interface of the planar P-N junction and the guard ring. What is also needed is a SAM-APD in which a common guard ring layer does not have to be etched to define the guard rings of the APDs made on the same substrate, and that does not require additional processing to passivate the periphery of the guard rings.

SUMMARY OF THE INVENTION

The invention provides a mesa-structure avalanche photodiode in which a p⁺ buffer region in the surface of the mesa structure effectively eliminates the sharply-angled, heavily doped part of the cap layer that existed adjacent the lightly-doped n-type multiplication layer and p-type guard ring before the buffer region was formed. This reduces the electric field strength at the ends of the planar epitaxial P-N junction and prevents edge breakdown in this junction. The SAM-APD includes a guard ring whose lateral extent is defined by a window formed in a masking layer prior to regrowth of the guard ring. This guard ring structure eliminates the need to perform additional processing steps to define the lateral extent of the guard ring and passivate the periphery of the guard ring.

The invention provides a semiconductor light detector comprising a semiconductor layer structure, a cap layer, a mesa structure that includes a buffer region, and a guard ring. The semiconductor layer structure is a layer structure of a first conductivity type, and includes a light absorption layer and an avalanche multiplication layer. The avalanche multiplication layer has a first impurity concentration. The cap layer is formed of a semiconductor material of a second conductivity type, is positioned proximate to the avalanche multiplication layer, and defines a first P-N junction with the multiplication layer. The mesa structure includes the cap layer, the first P-N junction, and an upper portion of the avalanche multiplication layer. The buffer region is a region of the second conductivity type extending into the mesa structure from the mesa surface. The guard ring is of epitaxial semiconductor material of the second conductivity type, and is positioned proximate to the buffer region of the mesa structure and surrounds the first P-N junction. The guard ring has a second impurity concentration, less than the first impurity concentration.

The invention also provides a method of making the above semiconductor light detector. In the method, a semiconductor layer structure is provided. The layer structure includes a cap layer of a first conductivity type, and light absorption and avalanche multiplication layers of a second conductivity type. The multiplication layer is positioned proximate to the cap layer, defining a first P-N junction. The semiconductor layer structure is etched to form a mesa structure including the cap layer and part of the avalanche multiplication layer. An impurity is introduced into the mesa surface to form a buffer region of the first conductivity type. A layer of epitaxial semiconductor material of the first conductivity type is then selectively regrown around the mesa structure to form a guard ring.

The invention also provides a semiconductor light detector comprising a semiconductor layer structure, a cap layer, a mesa structure, a masking layer covering part of the mesa surface and a guard ring having a lateral extent defined by a window in the masking layer. The semiconductor layer structure is a layer structure of a first conductivity type, and includes a light absorption layer and an avalanche multiplication layer. The avalanche multiplication layer has a first impurity concentration. The cap layer is formed of a semiconductor material of a second conductivity type, is positioned proximate to the avalanche multiplication layer, and defines a first P-N junction with the multiplication layer. The mesa structure includes the cap layer, the first P-N junction, and an upper portion of the avalanche multiplication layer.

The masking layer covers part of the mesa surface, and defines a window covering at least the side of the mesa structure. The guard ring is of epitaxial semiconductor material of the second conductivity type, and is co-extensive with the window. The guard ring has a second impurity concentration, less than the first impurity concentration.

Finally, the invention provides a method of making the above semiconductor light detector. In the method, a semiconductor layer structure is provided. The layer structure includes a cap layer of a first conductivity type, and light absorption and avalanche multiplication layers of a second conductivity type. The multiplication layer is positioned proximate to the cap layer, defining a first P-N junction. The semiconductor layer structure is etched to form a mesa structure including the cap layer and part of the avalanche multiplication layer. A layer of epitaxial semiconductor material of the first conductivity type is selectively regrown on part of the surface of the mesa structure to form a guard ring. The layer of epitaxial semiconductor material is selectively regrown to have a predetermined lateral extent relative to the mesa structure.

DETAILED DESCRIPTION OF THE INVENTION

Figure 1:
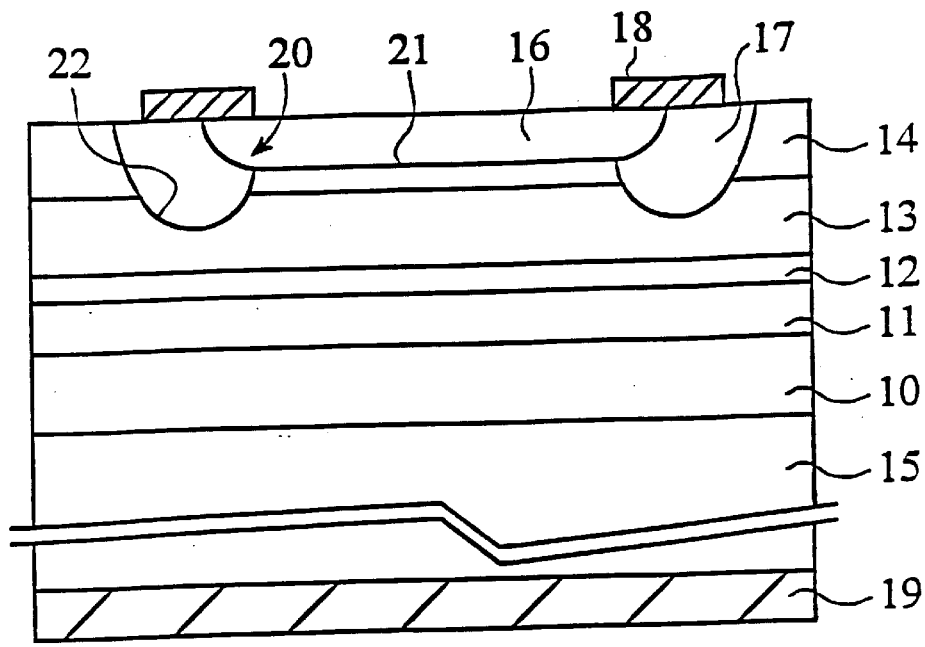
FIG. 1 is a cross-sectional view showing a conventional planar avalanche photodiode.
Figure 2:
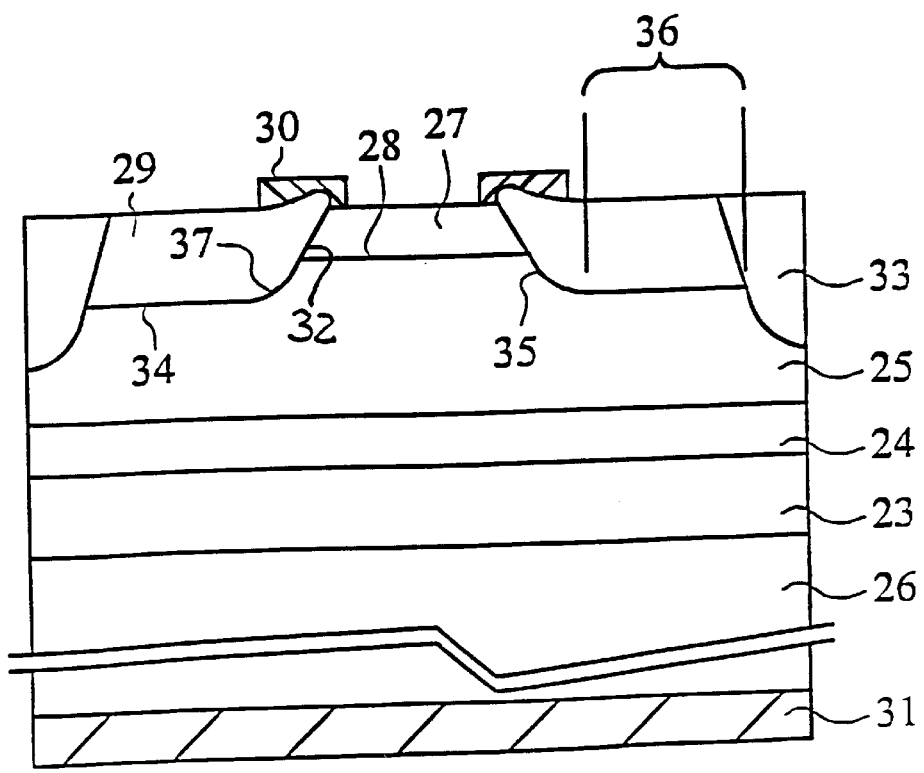
FIG. 2 is a cross-sectional view showing the inventors' prior mesa avalanche photodiode.
Figure 3:
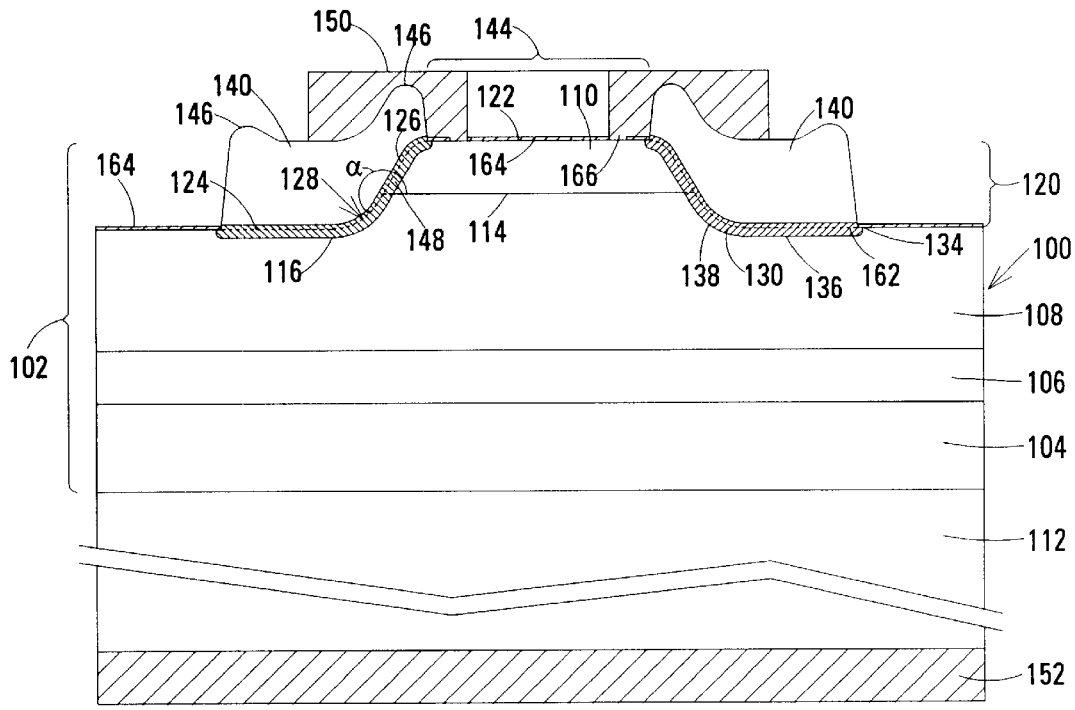
FIG. 3 is a cross-sectional view showing a first embodiment of a mesa avalanche photodiode according to the invention.

FIG. 3 shows a first embodiment of the avalanche photodiode (APD) 100 according to the invention. In this, the layer structure 102, composed of the n⁻ InGaAs light absorption layer 104, the n⁻ InGaAsP intermediate layer 106, the n InP avalanche multiplication layer 108 and the homogeneous p⁺ Inp cap layer 110, is located on the n⁺ InP substrate 112. The layers constituting the layer structure are epitaxially grown in sequence on the substrate. At the interface between the cap layer and the multiplication layer is the first P-N junction 114. The first P-N junction is an abrupt, planar junction between two epitaxially-grown layers. The first P-N junction is asymmetrical due to the cap layer having a substantially higher impurity concentration than the multiplication layer.

The mesa structure 120 extends through the cap layer 110 and part of the multiplication layer 108. In the mesa structure, the mesa top 122 is connected to the shoulder 124 by the sloping side 126. The surface 128 of the mesa structure is covered with the masking layer 164 which defines the annular windows 162 and 166. The masking layer 164 is typically a layer of silicon nitride and has three main roles. During fabrication of the SAM-APD 100, the masking layer defines the lateral extent of the guard ring, to be discussed below. After fabrication, the masking layer passivates the part of the mesa surface 128 not covered by the guard ring, and the part of the masking layer that covers the cap layer can serve as an antireflective coating.

The buffer region 130 is a heavily-doped p⁺ region extending into the mesa structure from the mesa surface 128. The concentration of impurities in the buffer region is preferably similar to that in the cap layer 110. The buffer region may be formed by making a shallow diffusion of p-type impurities into the side 126 and at least part of the shoulder 124 of the mesa structure. As will be described in more detail below, the buffer region is preferably formed by a selective diffusion of a p-type impurity into the part of the surface of the mesa structure defined by the window 162. However, if the passivating layer 164 is added after formation of the buffer region, the buffer region may alternatively be formed by a non-selective diffusion into the entire surface 128 of the mesa structure.

The buffer region 130 may alternatively be formed by implanting ions of a suitable p-type impurity into the surface of the mesa structure 128. The implantation is preferably a selective implantation into the side 126 and at least part of the shoulder 124 of the mesa structure, but may be non-selective. Compared with forming the buffer region by diffusion, forming the buffer region by ion implantation provides a more precise control of the impurity concentration in, and the depth of, the buffer region. However, forming the buffer region by ion implantation requires more processing steps.

The buffer region 130 forms a P-N junction with the multiplication layer 108. This P-N junction, the second P-N junction 116, is a gradual junction as a result of its being formed by diffusion or implantation of p-type impurities into the n-type multiplication region. The second P-N junction includes the planar portion 136 and the curved portion 138.

The buffer region 130 extends from the mesa surface 128 into the multiplication layer 108 and the cap layer 110. However, the characteristics of the portion of the buffer region in the cap layer are substantially the same as those of the cap layer due to the already-high level of p-type impurities in the cap layer. The buffer region also extends slightly into the guard ring 140, to be described below, and extends laterally under the masking layer 164. Thus, the masking layer passivates the intersection 134 of the second P-N junction 116 with the mesa surface 128.

The depth of the buffer region 130 in the mesa structure 120 is such that the buffer region is completely depleted during normal operation of the SAM-APD 100. During normal operation, the depletion region of the second P-N junction 116 extends through the buffer region into the guard ring 140.

The guard ring 140 extends from part-way across the cap layer 110 to partway across the shoulder 124 of the mesa structure 120 so that the guard ring covers the part of the mesa top 122 outside the central portion 144, and the side 126 and part of the shoulder 124 of the mesa structure 120. The guard ring 140 is formed by a single, selective, epitaxial re-growth process in which the guard rings of multiple APDs located on the substrate 112 are each independently grown in the window 162 in the masking layer 164. Independently re-growing the guard rings of multiple APDs in windows in the passivating layer eliminates the need to perform additional processing to divide a continuous guard ring layer into a guard ring for each of the multiple APDs, and to passivate the periphery of each guard ring. In the SAM-APD 100, the layer 164 passivates the surface of the mesa structure and defines the lateral extent of the guard ring in a single processing operation, as will be described below.

An APD in which the guard ring has been selectively regrown in the window 162 defined in the masking layer 164 is physically distinct from an APD in which the lateral extent of the guard ring is defined by etching back part of a guard ring layer. A selectively-regrown guard ring includes the accretion contours 146 adjacent the edges of the window 162. An etched-back regrown guard ring lacks such contours. Moreover, the mesa shoulder 124 of a selectively-regrown guard ring is flat, whereas, with an etched-back guard ring, the etch back process usually forms a second mesa having sides coincident with the lateral extent of the guard ring.

In the preferred embodiment, the guard ring 140 is formed from the same semiconductor material as the p$^+$ cap layer 110. However, the guard ring has a lower concentration of impurities than the cap layer 110 and the buffer region 130. This reduces the electric field in the guard ring. The buffer region effectively eliminates the sharply-angled, heavily doped part 148 of the cap layer that existed adjacent the lightly-doped n-type multiplication layer 108 and p-type guard ring before the buffer region was formed.

The P-side electrode 150 may be placed in contact with the cap layer 110. The N-side electrode 152 is formed on the lower surface of the semiconductor substrate 112. The electrodes may be annular or solid. For purposes of this disclosure, a solid electrode would completely cover either the cap layer 110 or the substrate 112. An annular electrode would define a centrally-located aperture.

In the embodiment shown in FIG. 3, the P-side electrode 150 is annular and the N-side electrode 152 is solid. The P-side electrode contacts the cap layer 110 though the window 166 in the masking layer 164. The masking layer otherwise covers the cap layer to passivate the surface of the cap layer. The thickness of the masking layer can be chosen in relation to the wavelength of the light to be detected by the SAM-APD 100 so that the masking layer operates as an anti-reflection coating, and increases the detection efficiency of the APD.

The absorption layer 104 and the intermediate layer 106 are considered intrinsic in the sense that no impurity dopants are intentionally added to them to alter their conductivity. In practice, however, these layers typically contain a low concentration of an n-type impurity.

The second P-N junction 116 includes the curved portion 138 and the planar portion 136. The contours of the second P-N junction are defined by the contours of the surface 128 of the mesa structure 120. Thus, the curved portion 138 follows the gently curving contour of the intersection of the side 126 and shoulder 124 of the mesa structure, and the planar portion 136 follows the plane contour of the shoulder of the mesa structure.

The first P-N junction 114 and the second P-N junction 116 collectively form a continuous P-N junction that extends across the width of the SAM-APD 100, although this continuous P-N junction changes from a gradual junction to an abrupt junction and back to a gradual junction across the width of the APD. The continuous P-N junction is curved where the first P-N junction joins the second P-N junction. However, seen from the multiplication layer 108, the angle a between the first P-N junction and the straight portion 134 of the second P-N junction is reflex, i.e., greater than 180°. The curvature of the P-N junction through a reflex angle reduces the electric field at this point to less than the electric field in the center of the first P-N junction. This reduction in the electric field at the edge of the first P-N junction eliminates edge breakdown. The P-N junction also curves at the curved portion 138 of the second P-N junction. Here, the P-N junction gently curves through an obtuse angle, i.e., an angle between 90° and 180°. This curvature causes a slight increase in the electric field at this point, but this does not cause edge breakdown because the electric field at this part of the second P-N junction is much less than that at the first P-N junction.

Figure 4A:
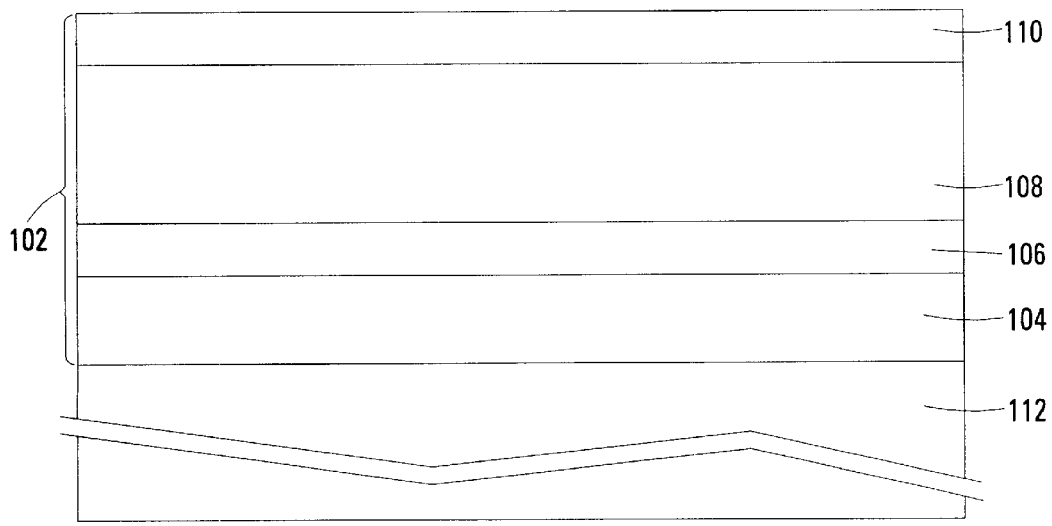
FIGS. 4A–4E are cross sectional views showing the method according to the invention of making the avalanche photodiode shown in FIG. 3.

FIGS. 4A–4E show the method according to the invention of making the avalanche photodiode 100. FIG. 4A shows the layer structure 102 formed by sequentially growing the n$^-$ InGaAs light absorption layer 104, the n$^-$ InGaAsP intermediate layer 106, the n InP avalanche multiplication layer 108 and the p$^+$ InP cap layer 110 on the n$^+$ InP substrate 112. The layers are grown on the substrate using a conventional epitaxial crystal growing process. In the preferred embodiment, the layers were grown using organo-metal chemical vapor deposition (OMCVD).

Figure 4B:
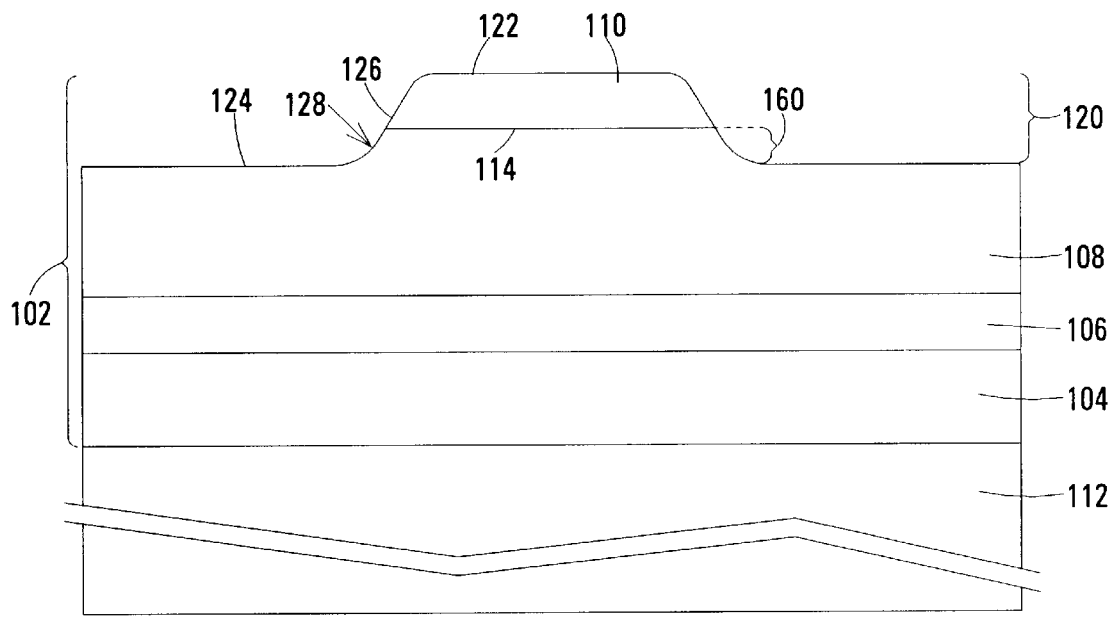

The part of the exposed surface of the cap layer 110 that will become the mesa top 122 is protected using a suitable mask (not shown). The mesa structure 120 is then defined by performing an etch to remove the unprotected portion of the cap layer 110 and the multiplication layer 108. The portion removed extends completely through the thickness of the cap layer, and extends partially through the thickness of the multiplication layer, as shown in FIG. 4B. The resulting mesa structure 120 includes the entire thickness of the cap layer 110 and the upper portion 160 of the multiplication layer. The etch exposes the planar P-N junction 114 formed between the cap layer and the multiplication layer at the side 126 of the mesa structure. Following the etch, the depth of the shoulder 124 below the first P-N junction 114 is such that, after regrowth of the guard ring 140 (FIG. 3), the electric field in the portion of the intermediate layer 106 under the shoulder 124 will be less than the electric field in the portion of the intermediate layer under the first P-N junction.

Figure 4C:
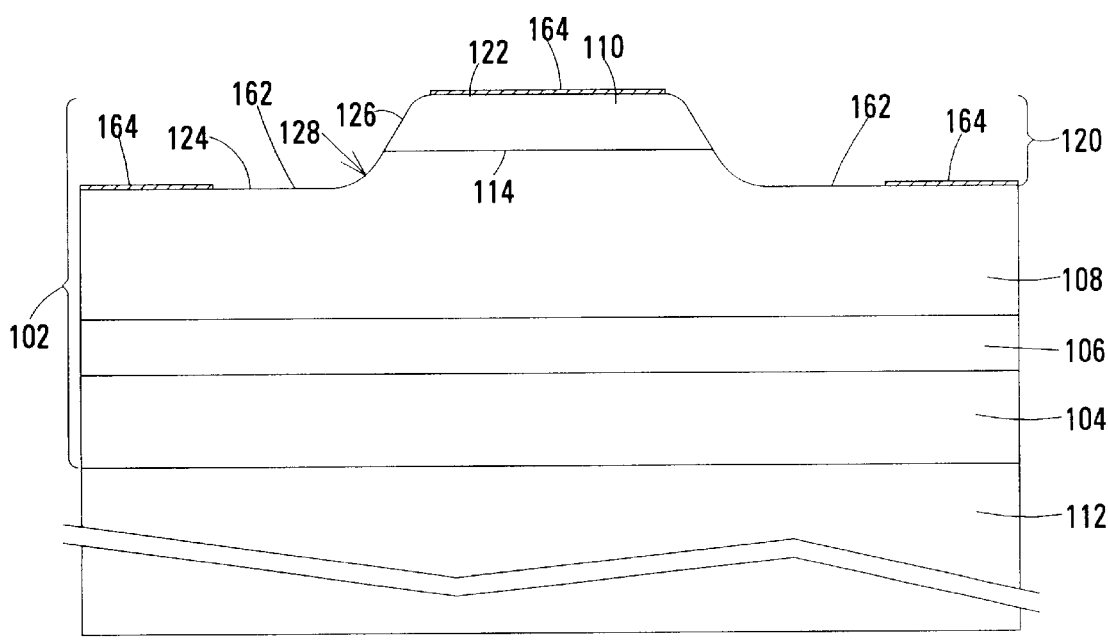

The masking layer 164 is then deposited on the surface 128 of the mesa structure 120 and is selectively removed using a conventional mask and etch process to define the annular window 162. The annular window extends from the periphery of the mesa top 122, across the mesa side 126, to part-way across the shoulder 124 as shown in FIG. 4C. The annular window defines the location on the mesa surface where the guard ring 140 will be regrown. Silicon nitride was used as the material of the masking layer in the preferred embodiment. As noted above, the masking layer also serves as a passivating layer that covers all of the mesa surface 128 except for the parts of the mesa surface that are later covered by the guard ring 140 and part of the P-side electrode 150.

Figure 4D:
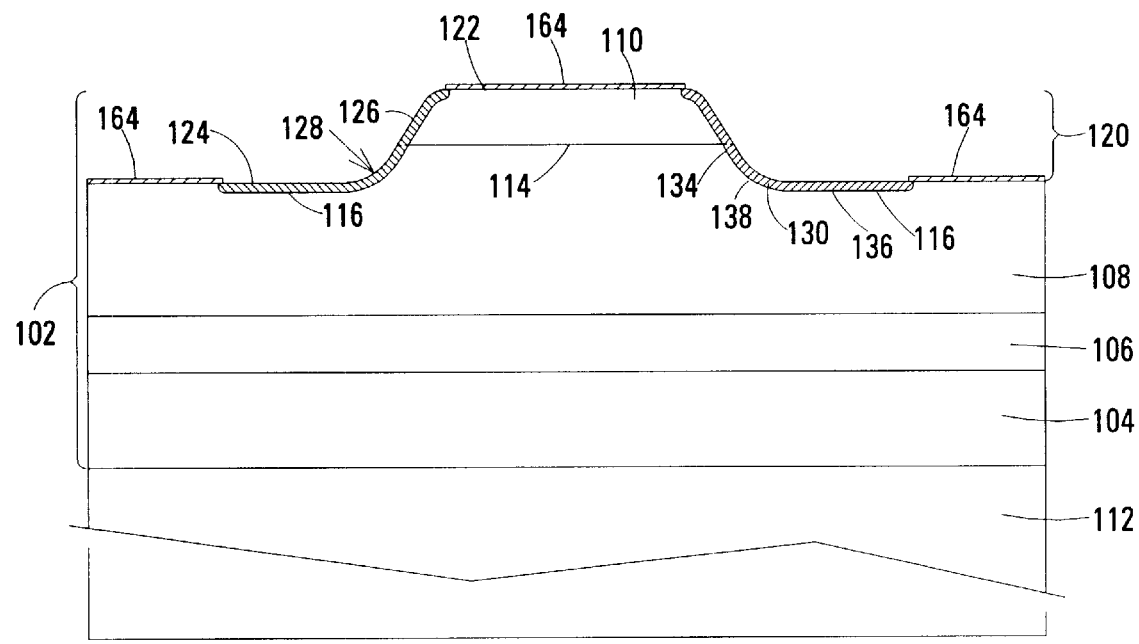

After the masking process just described, the layer structure is returned to the OMCVD reaction chamber and is heated in a phosphene (PH$_3$) atmosphere to a temperature below the temperature range at which normal epitaxial growth takes place. A flow of di-ethyl zinc, the dopant used in growing p-type Inp, is turned on for a predetermined time in the range of 5–10 minutes. This deposits a layer of zinc on the parts of the surface 128 of the layer structure not protected by the mask . The zinc then diffuses into the unprotected parts of the surface to form the buffer region 130, as shown in FIG. 4D. The diffusion operation is performed at a temperature below the temperature range in which good epitaxial growth takes place because, at higher temperatures, zinc deposited on the surface 128 re-evaporates and does not diffuse into the surface.

After the time required for forming the buffer region 130 has elapsed, the flow of di-ethyl zinc is turned off and the temperature of the layer structure 102 is increased to a temperature in the temperature range in which good epitaxial growth takes place so that the guard ring 140 can be regrown.

Alternatively, when the buffer layer 130 is to be formed by ion implantation, the layer structure 102 is placed in an ion implantation reactor after the masking process described above, and an implant of beryllium, magnesium or zinc ions is performed to form the buffer layer extending into the mesa structure to a depth of about $0.1 \pm 0.05$ $\mu$m. The implant is continued until a concentration in the range $10^{13}$–$10^{14}$ cm$^{-2}$ is obtained. The layer structure is then returned to the OMCVD reaction chamber and is heated to a temperature in the temperature range in which good epitaxial growth takes place so that the guard ring 140 can be regrown. Maintaining the layer structure at this temperature during the regrowth process also anneals the layer structure to repair the structural damage caused by the ion implantation process.

Figure 4E:
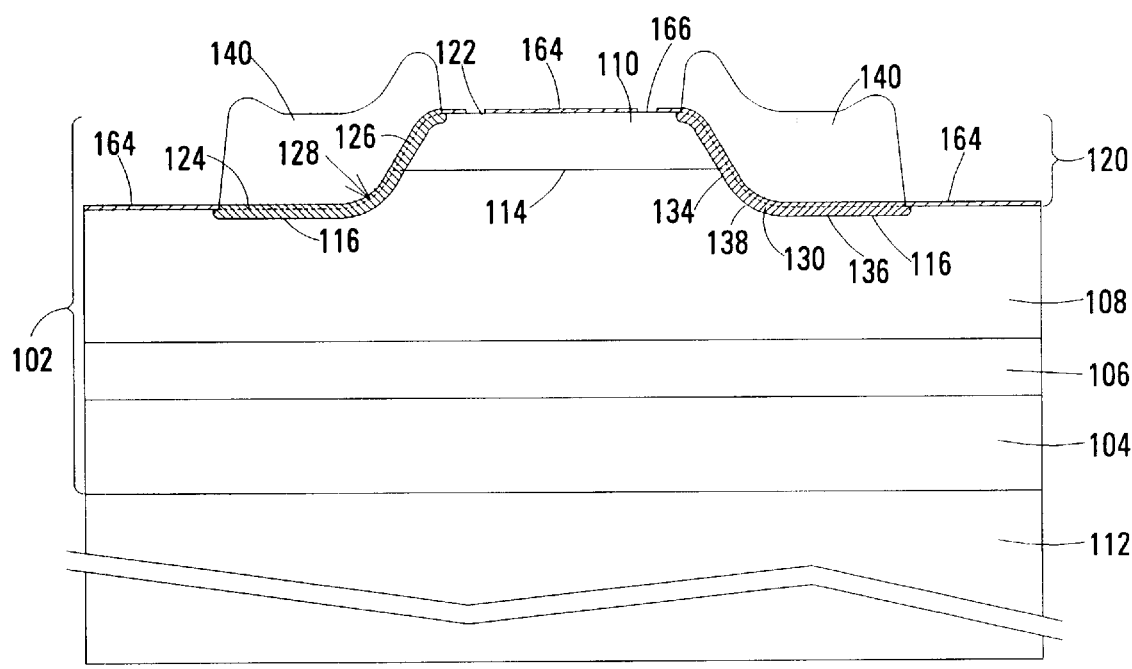

The guard ring 140 may be regrown using any epitaxial deposition process, e.g., vapor phase epitaxy or molecular beam epitaxy. However, OMCVD is preferred since it enables the buffer region 130 to be formed with negligible additional processing, as just described. With an appropriate choice of growth conditions, the p⁻ InP that will form the guard ring will grow on the exposed parts of the mesa surface 128, i.e., inside the window 162, but will not grow on the surface of the masking layer 164. Consequently, the guard ring grows to cover the peripheral portion of the mesa top 122, the side 126 and the part of the shoulder 124 of the mesa structure 120 that are located within the window 162. In particular, the guard ring covers the intersection of the side 126 of the mesa structure with the first planar P-N junction 114 between the cap layer 110 and the multiplication layer 108, as shown in FIG. 4E.

After regrowth of the guard ring is complete, the masking layer 164 is selectively etched to form the annular window 166. The P-side and N-side electrodes are then formed using conventional metal evaporation and lift-off techniques. The P-side electrode contacts the cap layer 110 through the window 166.

Growing the guard ring selectively so that the extent of the guard ring on the shoulder 124 of the mesa structure 120 is defined by the window 162 in the masking layer 164, and so that the guard rings of adjacent APDs formed in the layer structure 102 are individually formed in the same regrowth operation simplifies the fabrication process and increases the yield of good APDs. Growing the guard ring in the manner just described eliminates the need to perform an additional etch back or proton implant operation to separate the guard rings of adjacent APDs and to expose the mesa top. In addition, growing the guard ring with its lateral extent defined by the masking layer 164 eliminates the need to perform additional operations to passivate the outer periphery of the guard ring.

Forming the guard ring 140 by performing an epitaxial regrowth after the mesa structure 120 has been formed enables the guard ring to have a lower concentration of impurities than the adjacent multiplication layer 108. This impurity concentration relationship cannot be achieved using conventional diffusion techniques because, with diffusion technology, the greater the impurity concentration in the multiplication layer, the greater the concentration of impurities that must be diffused into the multiplication layer to form the guard ring with the opposite conductivity mode to the multiplication layer. This greatly increases the electric field in the guard ring. Epitaxially regrowing the guard ring enables the impurity concentration in the guard ring to be chosen independently of that in the multiplication layer. Specifically, the impurity concentration in the guard ring can be made substantially lower than that in the multiplication layer while still forming the guard ring from p-type material. The lower impurity concentration in the guard ring compared with conventional diffused APDs reduces the electric field in the guard ring.

The impurity concentration in the material of the guard ring 140 may be varied as regrowth of the guard ring progresses. For example, the impurity concentration in the part of the guard ring adjacent the multiplication layer 108 may be comparable with that of the multiplication layer, and the impurity concentration in parts of the guard ring remote from the multiplication layer may be greater than that of the multiplication layer. Moreover, the material of the guard ring may be changed in the course of the regrowth process.

Figure 5:
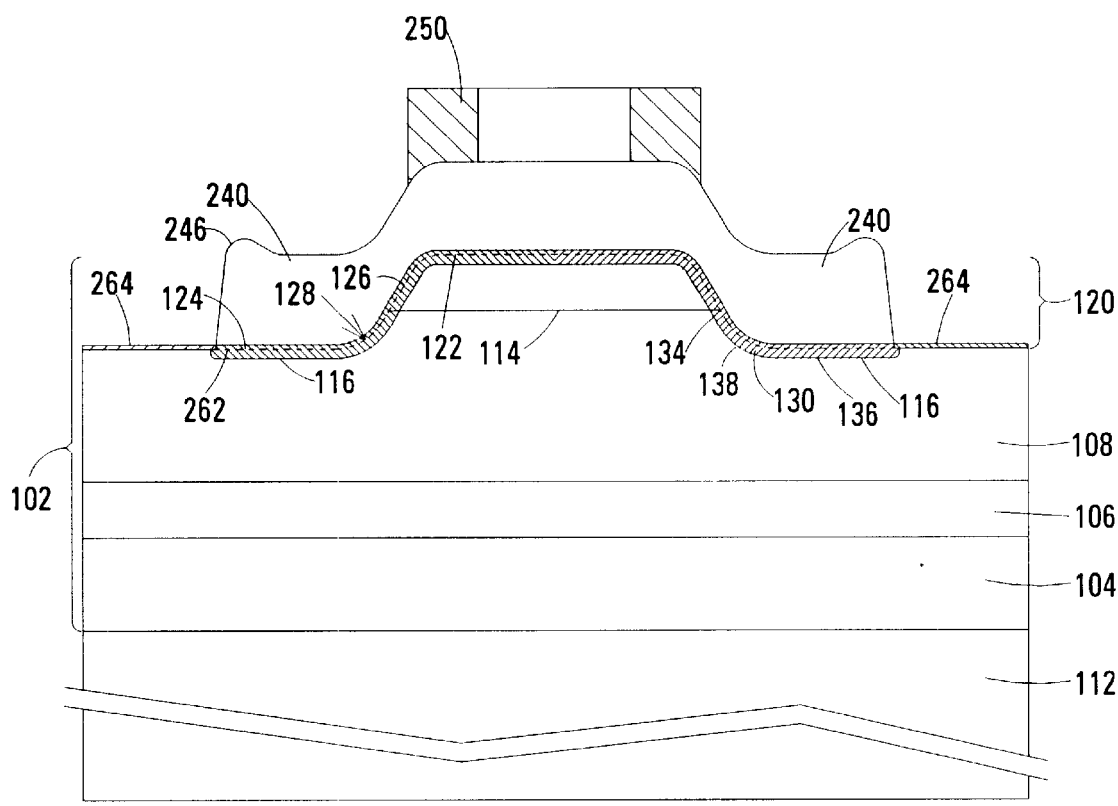
FIG. 5 is a cross-sectional view showing a second embodiment of a mesa avalanche photodiode according to the invention.

A second embodiment 200 of an APD according to the invention is shown in FIG. 5. In FIG. 5, elements that are the same as in the first embodiment shown in FIG. 3 are indicated by the same reference numeral and will not be described again here. Elements that are similar to elements in the first embodiment are indicated by the same reference numeral with 100 added.

In the second embodiment, the area of the guard ring is made larger than in the first embodiment. This increased area makes regrowth of the guard ring easier to control. To increase the size of the guard ring, the topology of the masking layer 264 differs from that of the masking layer 164. The masking layer 264 defines the single, circular window 262 that extends across the surface 128 of the mesa structure 120 from the shoulder 124 to the center of the top 122. As a result of the shape of the window 262, the buffer region 230 and the guard ring 240 are both circular, and extend across the surface of the mesa structure from the shoulder 124 to the center of the top 122. Although the guard ring 240 is regrown to cover the mesa structure 120, the masking layer 264 defines the lateral extent of the guard ring on the shoulder 124 of the mesa structure during regrowth, as in the first embodiment. Consequently, no etch back and passivation processing is required to define the lateral extent of the guard ring 240.

The annular p-contact 250 is deposited on the surface of the guard ring 240.

The easier control over regrowth of the guard ring 240 comes at the expense of a greater series resistance between the p-contact 250 and the cap layer 110. However, if this series resistance impairs performance, the series resistance can be reduced by etching back the center of the guard ring 240 to expose the cap layer. The annular p-contact is then deposited in direct contact with an annular portion of the cap layer. Unlike the inventors' prior technique of etching back the guard ring to define the lateral extent of the guard ring on the shoulder of the mesa structure, etching back the guard ring to expose part of the cap layer does not expose any p-n junction. Thus, no additional passivation steps are required after the guard ring has been etched back to expose the cap layer.

The second embodiment shown in FIG. 5 is made by the same method as that described above with reference to FIGS. 4A–4E.

Although the above-described embodiments of the invention relate to a semiconductor device formed of InGaAs/InP system compound semiconductors, the invention can be applied to semiconductor devices formed from other materials, e.g., InAlAs/InGaAs, AlGaAsSb, GaAs, Si and the like. In addition, the p-type layers and the n-type layers of the present invention may be replaced by n-type layers and p-type layers, respectively.

Although this disclosure describes illustrative embodiments of the invention in detail, it is to be understood that the invention is not limited to the precise embodiments described, and that various modifications may be practiced within the scope of the invention defined by the appended claims.

We claim:

1. A semiconductor light detector, comprising:
   a semiconductor layer structure of a first conductivity type, the semiconductor layer structure including a light absorption layer and an avalanche multiplication layer, the avalanche multiplication layer having a first impurity concentration;
   a cap layer formed of a semiconductor material of a second conductivity type and having a second impurity concentration significantly greater than the first impurity concentration, the cap layer being positioned proximate to the avalanche multiplication layer, and defining a first P-N junction, the first P-N junction being an abrupt, planar junction;
   a mesa structure including the cap layer, the first P-N junction, and an upper portion of the avalanche multiplication layer, the mesa structure having a mesa surface, and including a mesa top connected to a shoulder by a sloping side, the mesa structure additionally including a buffer region of the second conductivity type extending from the mesa surface into the sloping side and the shoulder of the mesa structure, the buffer region and the upper portion of the avalanche multiplication layer forming a second P-N junction; and
   a guard ring of epitaxial semiconductor material of the second conductivity type, the guard ring of epitaxial semiconductor material being positioned proximate to the buffer region of the mesa structure and surrounding the first P-N junction, the guard ring of epitaxial semiconductor material having a third impurity concentration, the third impurity concentration being significantly less than the first impurity concentration, in which:
   the buffer region has an impurity concentration similar to the second impurity concentration.

2. The semiconductor light detector of claim 1, in which the buffer region additionally extends partially into the cap layer.

3. The semiconductor light detector of claim 1, in which the first P-N junction and the second P-N junction collectively constitute a P-N junction having a portion near the mesa surface that curves through a reflex angle.

4. The semiconductor light detector of claim 1, in which the guard ring and the buffer region have the same lateral extent on the mesa surface.

5. The semiconductor light detector of claim 1, in which the buffer region is a region of an impurity of the second conductivity type diffused into the mesa surface.

6. The semiconductor light detector of claim 1, in which the buffer region is a region of an impurity of the second conductivity type implanted into the mesa surface.

7. A semiconductor light detector, comprising:
   a semiconductor layer structure of a first conductivity type, the semiconductor layer structure including a light absorption layer and an avalanche multiplication layer, the avalanche multiplication layer having a first impurity concentration;
   a cap layer formed of a semiconductor material of a second conductivity type, the cap layer being positioned proximate to the avalanche multiplication layer, and defining a first P-N junction;
   a mesa structure including the cap layer, the first P-N junction, and an upper portion of the avalanche multiplication layer, the mesa structure having a mesa surface and including a side;
   a masking layer covering part of the mesa surface, the masking layer defining a window overlapping at least the side of the mesa structure; and
   a guard ring of epitaxial semiconductor material of the second conductivity type, the guard ring of epitaxial semiconductor material being co-extensive with the window, the guard ring of epitaxial semiconductor material having a second impurity concentration, the second impurity concentration being less than the first impurity concentration.

8. The semiconductor light detector of claim 7, in which both the cap layer and the guard ring are formed of a first semiconductor material, the guard ring having an impurity concentration less than the dopant concentration of the cap layer.

9. The semiconductor light detector of claim 8, in which the mesa structure includes a buffer region of the second conductivity type extending into the mesa structure from the mesa surface.

10. The semiconductor light detector of claim 9, in which the buffer region is co-extensive with the window.

11. The semiconductor light detector of claim 7, in which the masking layer defines an annular window that overlaps at least the side of the mesa surface.

12. The semiconductor light detector of claim 7, in which the part of the masking layer extends over part of the cap layer and provides an anti-reflective coating on the cap layer.

* * * * *